US010170753B2

(12) United States Patent
Ren et al.

(10) Patent No.: US 10,170,753 B2
(45) Date of Patent: Jan. 1, 2019

(54) NANO-SILICON COMPOSITE NEGATIVE ELECTRODE MATERIAL USED FOR LITHIUM ION BATTERY, PROCESS FOR PREPARING THE SAME AND LITHIUM ION BATTERY

(71) Applicant: SHENZHEN BTR NEW ENERGY MATERIALS INC., Guangdong (CN)

(72) Inventors: Jianguo Ren, Guangdong (CN); Min Yue, Guangdong (CN); Youyuan Huang, Guangdong (CN); Xueqin He, Guangdong (CN)

(73) Assignee: Shenzhen BTR New Energy Materials Inc., Guangdong (CN)

( * ) Notice: Subject to any disclaimer, the term of this patent is extended or adjusted under 35 U.S.C. 154(b) by 75 days.

(21) Appl. No.: 14/992,800

(22) Filed: Jan. 11, 2016

(65) Prior Publication Data

US 2016/0211511 A1 Jul. 21, 2016

(30) Foreign Application Priority Data

Jan. 20, 2015 (CN) .......................... 2015 1 0027926

(51) Int. Cl.
*H01M 4/00* (2006.01)
*H01M 4/36* (2006.01)
(Continued)

(52) U.S. Cl.
CPC ............. *H01M 4/364* (2013.01); *C23C 16/24* (2013.01); *C23C 16/4417* (2013.01);
(Continued)

(58) Field of Classification Search
CPC .. H01M 4/8626; H01M 8/04283; H01M 8/20; H01M 8/2455
See application file for complete search history.

(56) References Cited

U.S. PATENT DOCUMENTS

2014/0363736 A1* 12/2014 Kim ..................... H01M 4/131
429/220
2015/0044564 A1* 2/2015 Wang .................... H01M 4/366
429/221
(Continued)

FOREIGN PATENT DOCUMENTS

CN   102214817   10/2011
CN   103474631   12/2013
(Continued)

OTHER PUBLICATIONS

Korean Office Action cited in Korean Application No. 20150181467 dated May 22, 2017.
(Continued)

*Primary Examiner* — Cynthia H Kelly
*Assistant Examiner* — Monique M Wills
(74) *Attorney, Agent, or Firm* — Workman Nydegger

(57) ABSTRACT

The present invention relates to a nano-silicon composite negative electrode material, including graphite matrix and nano-silicon material homogeneously deposited inside the graphite matrix, wherein the nano-silicon composite negative electrode material is prepared by using silicon source to chemical-vapor deposit nano-silicon particles inside hollowed graphite. The nano-silicon composite negative electrode material of the present invention has features of high specific capacity (higher than 1000 mAh/g), high initial charge-discharge efficiency (higher than 93%) and high conductivity. The preparation process of the present invention is easy to operate and control, and has low production cost and is suitable for industrial production.

16 Claims, 3 Drawing Sheets

(51) Int. Cl.
*H01M 4/38* (2006.01)
*H01M 4/587* (2010.01)
*H01M 4/62* (2006.01)
*H01M 4/04* (2006.01)
*H01M 4/13* (2010.01)
*H01M 4/139* (2010.01)
*C23C 16/24* (2006.01)
*C23C 16/44* (2006.01)
*H01M 10/0525* (2010.01)

(52) U.S. Cl.
CPC ....... *H01M 4/0426* (2013.01); *H01M 4/0471* (2013.01); *H01M 4/13* (2013.01); *H01M 4/139* (2013.01); *H01M 4/366* (2013.01); *H01M 4/386* (2013.01); *H01M 4/587* (2013.01); *H01M 4/625* (2013.01); *H01M 10/0525* (2013.01)

(56) References Cited

U.S. PATENT DOCUMENTS

| | | | | |
|---|---|---|---|---|
| 2015/0064552 A1* | 3/2015 | Huang | ................ | H01M 4/366 429/212 |
| 2015/0246816 A1* | 9/2015 | Liu | ................ | H01M 4/13 216/39 |
| 2016/0164079 A1* | 6/2016 | Bae | ................ | H01M 4/366 429/231.8 |

FOREIGN PATENT DOCUMENTS

| | | |
|---|---|---|
| CN | 103682287 | 3/2014 |
| JP | 2000-268824 | 9/2000 |
| JP | 09249407 | 8/2002 |
| JP | 200268824 | 9/2003 |
| JP | 2008-27897 | 2/2008 |
| JP | 2010501970 | 1/2010 |
| JP | 2010-525549 | 7/2010 |
| JP | 2012-99452 | 7/2010 |
| JP | 2011243571 | 12/2011 |
| JP | 2012009452 | 1/2012 |
| JP | 2013110112 | 6/2013 |
| JP | 2014197551 | 10/2014 |
| KR | 1020060051615 | 9/2005 |

OTHER PUBLICATIONS

Chinese Office Action cited in Chinese Application No. 201510027926.4 dated Dec. 21, 2016.
Japanese Office Action cited in Japanese Application No. 2015219421 dated.
Korean Office Action cited in Korean Application No. 10-2015-0181467 dated Nov. 28, 2018.

* cited by examiner

NANO-SILICON COMPOSITE NEGATIVE ELECTRODE MATERIAL USED FOR LITHIUM ION BATTERY, PROCESS FOR PREPARING THE SAME AND LITHIUM ION BATTERY

TECHNICAL FIELD

The present invention belongs to the technical field of lithium ion battery, and specifically relates to a nano-silicon composite negative electrode material used for lithium ion battery, a process for preparing the same and a lithium ion battery.

BACKGROUND ART

Lithium ion battery is an ideal power source for portable electronic equipments, electric vehicles, energy storage systems. It is the core of the research and development field of the lithium ion battery to develop a novel electrode material having high specific energy, better safety and low cost. Studies on novel negative electrode materials have an important meaning to the development of new-generation lithium ion battery. The negative electrode materials of the current mature lithium ion battery are mainly graphite materials having a theoretical specific capacity of 372 mAh/g and limited developing potential, and thus cannot meet the demand of the future lithium ion battery on high-energy density. It is found by studies that the reversible lithium storage capacity of the metals, such as Al, Sn, Sb, Si and the like which can be alloyed to Li, and other alloy materials, is far greater than graphite negative electrode. For example, the theoretical capacity of Si negative electrode is as high as 4200 mAh/g. However, such negative electrode material has a greater lithiation/delithiation volume expansion and shrinkage (>300%), and high volume effect renders worse cycle stability, resulting in that there is a certain distance between these systems and practical level.

In order to increase the cycle performance of the silicon negative electrode, those skilled in the art would generally improve the volume expansion effect of the silicon material by the nano-crystallization of silicon, alloying of silicon with metals, and complexing of silicon and carbon materials, wherein the composite material of nano-silicon and graphite has a greater application prospect; the synthesis of nano-silicon and the homogeneous dispersion thereof in graphite matrix are the key technologies.

CN103474667A discloses a silicon-carbon composite negative electrode material, comprising nano-silicon/graphite particles, first carbon coating layer and organic cracking carbon layer, wherein the nano-silicon/graphite particles are spherical or spherical-like composite particles formed by coating graphite as inner core with nano-silicon particle layer. CN100422112C discloses a silicon-carbon composite material having a spherical core-shell structure, wherein the inner core part of the core-shell is spherical carbon particles having an average particle size of 1-45 micrometer; the carbon particles are one or a mixture of two or three materials selected from the group consisting of graphitized intermediate phase carbon globules, hard carbon globule and spherical graphite; the shell layer of the core-shell is composed of carbon and silicon crystal particles having an average particle size of from 10 nanometer to 4 micrometer. The aforesaid structures both involve coating nano-silicon onto the surface of graphite particles, which easily result in uneven distribution of the nano-silicon, being unable to effectively use the space inside the graphite particles, and being unable to further increase the loading capacity of the nano-silicon.

The hollowing treatment of graphite will be helpful to embedding nano-silicon into the inside of graphite particles, so as to effectively increase the dispersibility and loading capacity of the nano-silicon.

CN103682287A discloses a silicon-based negative electrode material embedded with a composite core-shell structure, wherein the inner core is a structure formed by embedding nano-silicon particles into the inner voids of hollowed graphite; and the shell is non-graphite carbon material; and the inner core is obtained by mixing and drying the nano-silicon obtained by mechanical grinding with the hollowed graphite in organic solvent. However, the nano-silicon particles are very easy to agglomerate during the drying, and thus cannot form the very homogeneous and monodispersed composite state of the nano-silicon particles inside the hollowed graphite. The agglomerated nano-silicon will gradually fuse during the charge and discharge process to form large-grained silicon, and the cycle and expansion performance will notably degrade. CN102214817A discloses a carbon/silicon/carbon nano composite negative electrode material and process for preparing the same, comprising depositing nano-silicon on carbon matrix by chemical vapor deposition, and then coating nano-carbon onto the surface of the nano-silicon by chemical vapor deposition. The carbon matrix material is selected from the group consisting of porous carbon, carbon nanotube and graphene. However, common porous carbon material (e.g. activated carbon) has too small voids to effectively support nano-silicon material. The carbon nanotube or graphene itself is easy to agglomerate, and thus cannot achieve homogeneous deposition of nano-silicon material on the surface thereof.

Thus it is a technical problem to be solved in the lithium ion battery field that how to prepare nano-scale silicon particles, to achieve homogeneous and monodispersed loading of nano-silicon inside graphite particles, to effectively reduce the cycle expansion of the material while ensuring high capacity, and to increase cycle performance, so as to prepare silicon-based negative electrode material having high capacity and long service life.

Contents of the Invention

In light of the shortcomings of the prior arts, the first object of the present invention lies in providing a nano-silicon composite negative electrode material used for lithium ion battery. The composite negative electrode material of the present invention has advantages of good electrical conductivity, high specific capacity, long cycle life, high initial charge-discharge efficiency and low cycle expansion.

In order to achieve the aforesaid object, the present invention applies the following technical means: a nano-silicon composite negative electrode material, including graphite matrix and nano-silicon material homogeneously deposited inside the graphite matrix.

Preferably, the nano-silicon composite negative electrode material further includes amorphous carbon coating layer and nano-conductive material coating layer on the surface of the graphite matrix.

The nano-silicon composite negative electrode material of the present invention is characterized in high specific capacity, high initial charge-discharge efficiency and high electrical conductivity.

Preferably, the nano-silicon composite negative electrode material is composed of graphite matrix and nano-silicon material homogeneously deposited inside the graphite matrix.

Preferably, the nano-silicon composite negative electrode material is composed of graphite matrix, nano-silicon material homogeneously deposited inside the graphite matrix, amorphous carbon coating layer and nano-conductive material coating layer on the surface of the graphite matrix.

Preferably, the nano-silicon material is crystal and/or non-crystal, preferably monodispersed nano-silicon particles.

Preferably, the nano-silicon material has an average particle size of from 1.0 to 1000.0 nm, e.g. 2-50 nm, 10-150 nm, 100-500 nm, 400-1000 nm, 500-800 nm and the like.

Preferably, the nano-silicon material has a content of from 1.0 to 80.0 wt. % in the negative electrode material, e.g. 1.5 wt. %, 2.0 wt. %, 3.4 wt. %, 5.0 wt. %, 11.5 wt. %, 21.0 wt. %, 35.5 wt. %, 44.6 wt. %, 55.5 wt. %, 64.6 wt. %, 75.5 wt. % and the like, preferably 2.0-60.0 wt. %, further preferably 3.0-50.0 wt. %. If the nano-silicon material has a too low content in the negative electrode material, it will has a low specific capacity; if the nano-silicon material has a too high content in the negative electrode material, it will has a high cycle expansion. Thus, the nano-silicon material of the present invention has a content of from 1.0 to 80.0 wt. % in the negative electrode material.

Preferably, the amorphous carbon coating layer is obtained by coating with pitch and/or polymers and carbonizing, preferably by coating with one or a mixture of at least two selected from the group consisting of coal pitch, petroleum pitch, mesophase pitch and polymers and processing at a high temperature of from 500 to 1200° C., or the amorphous carbon coating layer is obtained by decomposing one or a mixture of at least two of organic carbon source gases at a high temperature, preferably decomposing one or a mixture of at least two selected from the group consisting of methane, ethane, propane, ethylene, acetylene, benzene, toluene, dimethylbenzene and ethanol.

Preferably, the amorphous carbon coating layer has a thickness of from 5.0 to 1000.0 nm, e.g. 5-50 nm, 10-150 nm, 150-500 nm, 440-950 nm, 500-800 nm and the like, preferably 10.0-500.0 nm, further preferably 50.0-200.0 nm.

Preferably, the nano-conductive material coating layer comprises one selected from the group consisting of carbon nanotube, graphene, conductive graphite, carbon fiber, nano graphite and conductive carbon black, or a combination of at least two selected therefrom.

Preferably, the nano-conductive material coating layer has a content of from 0.1 to 10.0 wt. % in the negative electrode material, e.g. 0.3 wt. %, 0.9 wt. %, 2.0 wt. %, 5.0 wt. %, 9.5 wt. % and the like, preferably 0.5-8.0 wt. %, further preferably 1.0-7.0 wt. %.

The second object of the present invention lies in providing a process for preparing a nano-silicon composite negative electrode material, characterized in chemical-vapor depositing nano-silicon particles with silicon source inside hollowed graphite.

By homogeneously depositing nano-silicon particles inside hollowed graphite material according to the preparation process of the present invention, the inner voids of the hollowed graphite provide much space for loading the nano-silicon, which may effectively increase the loading capacity and the dispersibility of the nano-silicon in the negative electrode material. The chemical vapor depositing method can form monodispersed nano-silicon particles inside the graphite material and avoid secondary agglomeration of the nano-silicon material. Moreover, the chemical vapor depositing method can also avoid surface oxidation of the nano-silicon material and increase the initial charge-discharge efficiency of the negative electrode material.

Preferably, the process includes the following steps:
(1) Preparing hollowed graphite;
(2) Chemical-vapor depositing nano-silicon particles with silicon source inside the hollowed graphite; and optionally the following steps:
(3) Mechanically fusing the material obtained in step (2), and then conducting amorphous-carbon coating;
(4) Proceeding the material obtained in step (3) to nano-conductive material coating modification; enhancing the contact between the conductive material and the composite material and increasing the conductive performance of the composite material by coating the nano-conductive material on the surface of the composite material;
(5) Sieving and demagnetizing the material obtained in step (4).

Preferably, the hollowed graphite is prepared by mechanical processing.

Preferably, the mechanical processing comprises processing graphite material into graphite particles, and then grinding to obtain the hollowed graphite.

Preferably, the graphite particles have a median particle size of from 5.0 to 25.0 μm, e.g. 5.5-8.0 μm, 7.0-15.0 μm, 10-20 μm and the like; the hollowed graphite obtained by grinding has a median particle size of 1.0 to 10.0 μm, e.g. 1.2-5.0 μm, 3.0-7.5 μm, 5.0-9.8 μm, and the like.

Preferably, the processing comprises smashing, demagnetizing and sieving graphite material to obtain graphite particles having a median particle size of from 5.0 to 25.0 μm, and then grinding to obtain hollowed graphite having a median particle size of from 1.0 to 10.0 μm.

Preferably, the grinding is mechanical grinding, preferably dry grinding and/or wet grinding, further preferably wet grinding;

Preferably, the wet grinding is fulfilled by any one of high speed stirred mill, ball grinding mill, tube mill, cone mill, rod mill and sand mill.

Preferably, the silicon source is one selected from the group consisting of $SiH_4$, $Si_3H_8$, $SiCl_4$, $SiHCl_3$, $Si_2Cl_6$, $SiH_2Cl_2$ or $SiH_3Cl$, or a combination of at least two selected therefrom.

Preferably, the chemical vapor deposition is one selected from the group consisting of thermochemical vapor deposition, plasma-enhanced chemical vapor deposition and microwave plasma-assisted chemical vapor deposition.

Preferably, the chemical vapor deposition is carried out in one device selected from the group consisting of rotary furnace, tube furnace or fluidized bed.

Preferably, the chemical vapor deposition is carried out at 400-1150° C., e.g. 410° C., 420° C., 450° C., 500° C., 550° C., 600° C., 650° C., 700° C., 800° C., 900° C., 1000° C., 1050° C., 1080° C., 1100° C., 1140° C. or 1145° C. The depositing time is determined by the content of the nano-silicon material in the negative electrode material expected to be prepared.

Preferably, the coating in step (3) is one selected from the group consisting of solid phase coating, liquid phase coating or gaseous phase coating.

Preferably, the coating modification in step (4) is one selected from the group consisting of mechanical modification, nano-dispersion or liquid phase coating. The mechanical modification, nano-dispersion or liquid phase coating may promote homogeneous dispersion of the nano-conductive material on the surface of the composite material and avoid agglomeration of the nano-conductive material.

Preferably, the mechanical modification is carried out in one device selected from the group consisting of ball mill, fusion machine and VC mixing machine.

The preparation process of the present invention can also be used for preparing the nano-silicon composite negative electrode material of the present invention, and can achieve better effects.

The third object of the present invention further lies in providing a lithium ion battery comprising the nano-silicon composite negative electrode material of the present invention or the nano-silicon composite negative electrode material prepared by the preparation process of the present invention.

The nano-silicon composite negative electrode material of the present invention has features of high specific capacity (higher than 1000 mAh/g), high initial charge-discharge efficiency (higher than 93%) and high conductivity. The preparation process of the present invention is easy to operate and control, and has low production cost and is suitable for industrial production.

EMBODIMENTS

In order to understand the present invention, the present invention provides the following examples. Those skilled in the art shall know that the examples are used only for understanding the present invention, and shall not be deemed as specific limitations of the present invention.

Example 1

(1) 500 g of natural spherical graphite powder having an average particle size of 16-19 μm and having a carbon content of 99.95% and 1 L of water were added into a ball milling tank and homogeneously stirred. Then 4 kg of zirconia balls having a diameter of 10 mm were added. The ball mill had a rotate speed of 480 r/min. After ball milling for 5-25 h, extraction filtration and drying were carried out to obtain hollowed graphite material having a particle size of 1.0 μm;

(2) 500 g of the hollowed graphite was placed in a rotary furnace. The rotating speed was adjusted to 0.5 r/min After increasing the temperature at a rate of 5.0° C./min to 700° C. under the protection of high-purity nitrogen having a flow rate of 1.0 L/min, high-purity nitrogen was changed to a gas mixture of high-purity hydrogen and $SiHCl_3$, wherein the flow rate was maintained at 10.0 L/min. After maintaining the temperature for 3.0 h, the gas was changed to high-purity nitrogen, then naturally cooled to room temperature to obtain hollowed graphite/nano-silicon composite material, wherein the nano-silicon material had an average particle size of 80.0 nm;

(3) The hollowed graphite/nano-silicon composite material was added into a fusion machine for fusing for 4 h to obtain fusion precursor material. The fusion precursor material and pitch were added into a VC mixing machine in a mass ratio of 85:15, mixed and coated for 1 h, then placed in a roller kiln, increased to a temperature of 950° C. at a rate of 5° C./min under nitrogen protection environment, maintained at such temperature for 20 h, naturally cooled to room temperature, then crushed, smashed, sieved to obtain nano-silicon/graphite composite material coated by amorphous carbon, wherein the amorphous carbon coating layer had a thickness of 100.0 nm;

(4) The nano-silicon/graphite composite material coated by amorphous carbon was homogeneously mixed with conductive carbon black Super-P in a mass ratio of 95.0:5.0 in a fusion machine, sieved and demagnetized to obtain final nano-silicon composite negative electrode material, wherein the nano-silicon material had a content of 30.0 wt. % in the negative electrode material.

Figure 1:
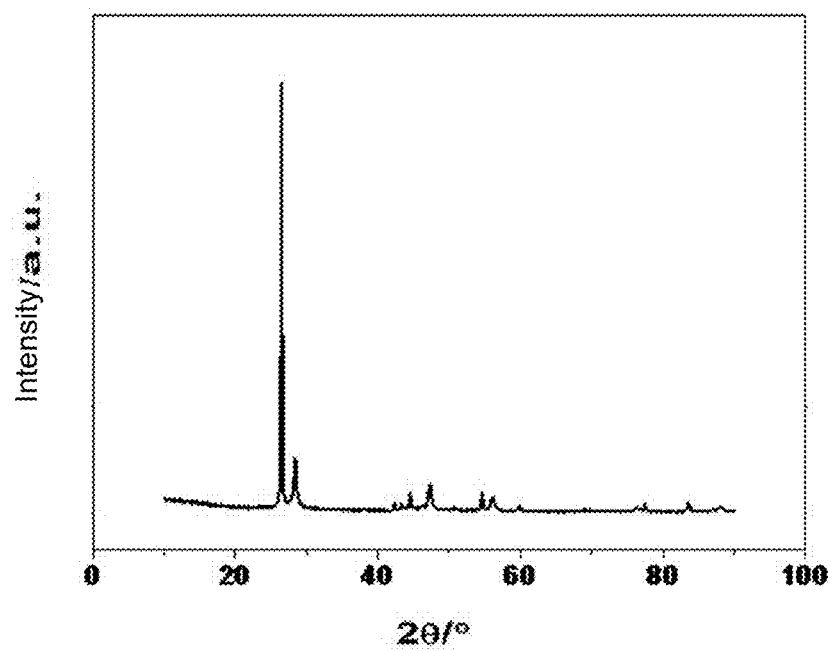
FIG. 1 refers to an X-ray diffraction spectrum of the nano-silicon composite negative electrode material of Example 1.
Figure 2:
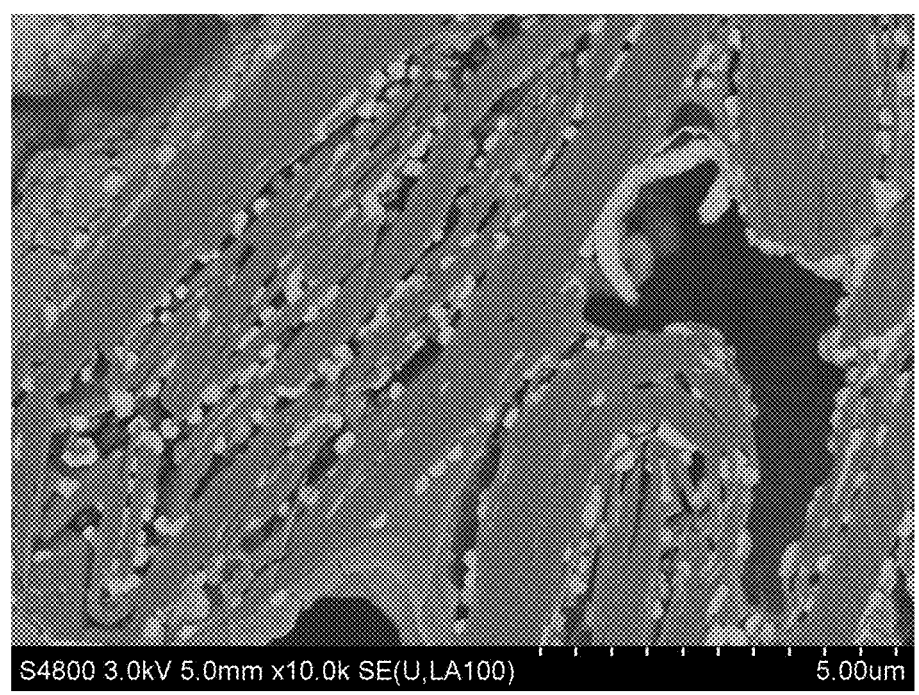
FIG. 2 refers to a section scanning electron microscopy of the nano-silicon composite negative electrode material of Example 1.

FIG. 1 refers to an X-ray diffraction spectrum of the nano-silicon composite negative electrode material of Example 1. The diffraction peaks centered at 28.6°, 47.5° and 56.3° respectively correspond to crystal surfaces of crystalline silicons (111), (220) and (311), which shows that the negative electrode material contains nano-crystalline silicon obtained by chemical vapor deposition. FIG. 2 refers to a section scanning electron microscopy of the nano-silicon composite negative electrode material of Example 1, from which it can be observed that the nano-silicon particles are embedded between the graphite layers, and the nano-silicon particles show a monodispersed state.

Figure 3:
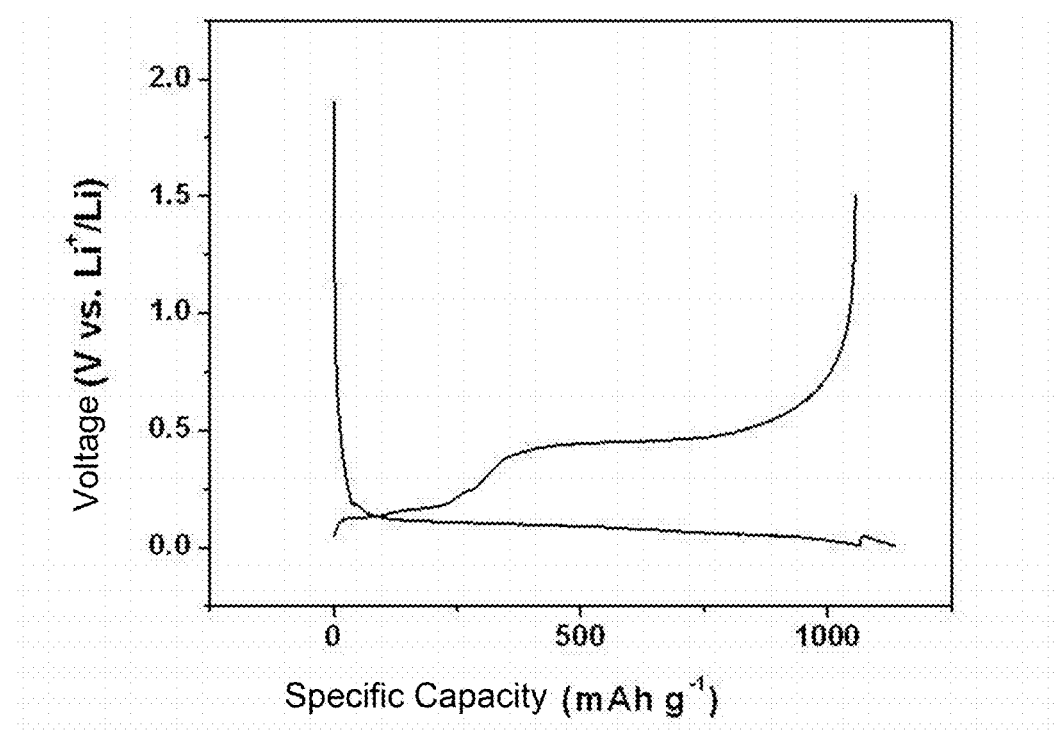
FIG. 3 refers to a first charge-discharge curve of the nano-silicon composite negative electrode material of Example 1.

FIG. 3 refers to a first charge-discharge curve of the nano-silicon composite negative electrode material of Example 1, wherein the charge (lithiation) specific capacity of the material is 1163.7 mAh/g; the discharge (delithiation) specific capacity is 1086.9 mAh/g; and the initial charge-discharge efficiency achieves 93.4%.

Figure 4:
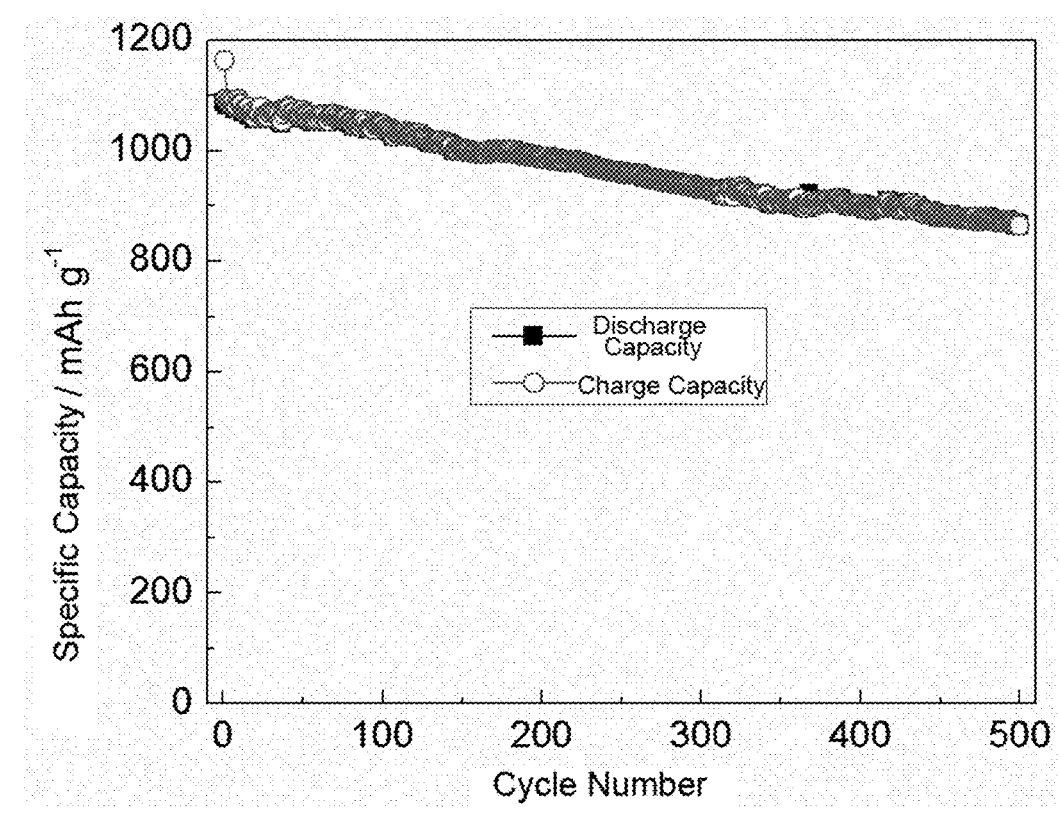
FIG. 4 refers to a cycle performance curve of the nano-silicon composite negative electrode material of Example 1.

FIG. 4 refers to a cycle performance curve of the nano-silicon composite negative electrode material of Example 1, wherein the negative electrode material has a capacity retention rate of 80.1% after 500 cycles.

Example 2

(1) 500 g of synthetic graphite powder having an average particle size of 10-13 μm and having a carbon content of 99.95% and 1 L of water were added into a ball milling tank and homogeneously stirred. Then 3 kg of zirconia balls having a diameter of 5 mm were added. The ball mill had a rotate speed of 800 r/min After ball milling for 25-40 h, extraction filtration and drying were carried out to obtain hollowed graphite material having a particle size of 8.0 μm;

(2) 500 g of the hollowed graphite was placed in a rotary furnace. The rotating speed was adjusted to 2.0 r/min After increasing the temperature at a rate of 3.0° C./min to 700° C. under the protection of high-purity nitrogen having a flow rate of 1.0 L/min, high-purity nitrogen was changed to a gas mixture of high-purity hydrogen and $SiH_4$, wherein the flow rate was maintained at 2.0 L/min After maintaining the temperature for 0.5 h, the gas was changed to high-purity nitrogen, then naturally cooled to room temperature to obtain hollowed graphite/nano-silicon composite material, wherein the nano-silicon material had an average particle size of 1.0 nm;

(3) The hollowed graphite/nano-silicon composite material was added into a fusion machine for fusing for 2 h to obtain fusion precursor material. The fusion precursor material was placed in a rotary furnace and increased to a temperature of 900° C. at a rate of 5° C./min Methane gas was fed at a rate of 0.2 L/min $N_2$ was fed into the whole reaction process furnace at a controlled flow rate of 0.1 L/min. After reacting for 0.5 h, the reactants were naturally cooled to room temperature, then crushed, smashed, sieved to obtain nano-silicon/graphite composite material coated by amorphous carbon, wherein the amorphous carbon coating layer had a thickness of 5.0 nm;

(4) The nano-silicon/graphite composite material coated by amorphous carbon was homogeneously mixed by mechanical fusion with graphene in a mass ratio of 99.9:0.1, sieved and demagnetized to obtain final nano-silicon composite negative electrode material, wherein the nano-silicon material had a content of 1.0 wt. % in the negative electrode material.

Example 3

(1) 500 g of natural spherical graphite powder having an average particle size of 16-19 μm and having a carbon content of 99.95% and 1 L of water were added into a ball milling tank and homogeneously stirred. Then 4 kg of zirconia balls having a diameter of 3 mm were added. The ball mill had a rotate speed of 800 r/min After ball milling for 40-60 h, extraction filtration and drying were carried out to obtain hollowed graphite material having a particle size of 5.0 μm;

(2) 500 g of the hollowed graphite was placed in a tub furnace. The rotating speed was adjusted to 0.5 r/min After increasing the temperature at a rate of 5.0° C./min to 1000° C. under the protection of high-purity nitrogen having a flow rate of 2.5 L/min, high-purity nitrogen was changed to a gas mixture of high-purity hydrogen and $SiCl_4$, wherein the flow rate was maintained at 10.0 L/min After maintaining the temperature for 8.0 h, the gas was changed to high-purity nitrogen, then naturally cooled to room temperature to obtain hollowed graphite/nano-silicon composite material, wherein the nano-silicon material had an average particle size of 1000.0 nm;

(3) The hollowed graphite/nano-silicon composite material was added into a fusion machine for fusing for 6 h to obtained fusion precursor material. The fusion precursor material was placed in a rotary furnace and increased to a temperature of 600° C. at a rate of 3° C./min Acetylene gas was fed at a rate of 0.2 L/min $N_2$ protection atmosphere was fed into the whole reaction process furnace at a controlled flow rate of 0.5 L/min After reacting for 4 h, the reactants were naturally cooled to room temperature, then crushed, smashed, sieved to obtain nano-silicon/graphite composite material coated by amorphous carbon, wherein the amorphous carbon coating layer had a thickness of 1000.0 nm;

(4) The nano-silicon/graphite composite material coated by amorphous carbon was homogeneously mixed by nano-dispersion with carbon nanotubes in a mass ratio of 90.0: 10.0, sieved and demagnetized to obtain final nano-silicon composite negative electrode material, wherein the nano-silicon material had a content of 80.0 wt. % in the negative electrode material.

Example 4

(1) 500 g of synthetic graphite powder having an average particle size of 10-13 μm and having a carbon content of 99.95% and 1 L of water were added into a ball milling tank and homogeneously stirred. Then 5 kg of zirconia balls having a diameter of 10 mm were added. The ball mill had a rotate speed of 1000 r/min. After ball milling for 25-40 h, extraction filtration and drying were carried out to obtain hollowed graphite material having a particle size of 3.0 μm;

(2) 500 g of the hollowed graphite was placed in a fluidized bed. After increasing the temperature at a rate of 3.0° C./min to 800° C. under the protection of high-purity nitrogen having a flow rate of 4.5 L/min, high-purity nitrogen was changed to a gas mixture of high-purity hydrogen and $Si_3H_8$, wherein the flow rate was maintained at 10.0 L/min After maintaining the temperature for 5.0 h, the gas was changed to high-purity nitrogen, then naturally cooled to room temperature to obtain hollowed graphite/nano-silicon composite material, wherein the nano-silicon material had an average particle size of 500 nm;

(3) The hollowed graphite/nano-silicon composite material was added into a fusion machine for fusing for 3 h to obtain fusion precursor material. The fusion precursor material and pitch were dispersed for 1 h in ethanol in a mass ratio of 80:20, wherein the solid content thereof was controlled at 15%, stirred and dispersed at a rate of 1000 r/min for 1 h, then dried and placed in a roller kiln, increased to a temperature of 500° C. at a rate of 5° C./min under nitrogen protection environment, and maintained at such temperature for 15 h, naturally cooled to room temperature, then crushed, smashed, sieved to obtain nano-silicon/graphite composite material coated by amorphous carbon, wherein the amorphous carbon coating layer had a thickness of 200 nm;

(4) The nano-silicon/graphite composite material coated by amorphous carbon was homogeneously mixed by mechanical fusion with graphene in a mass ratio of 99.0:1.0, sieved and demagnetized to obtain final nano-silicon composite negative electrode material, wherein the nano-silicon material had a content of 50.0 wt. % in the negative electrode material.

Example 5

(1) 500 g of natural spherical graphite powder having an average particle size of 21-24 μm and having a carbon content of 99.95% and 1 L of water were added into a ball milling tank and homogeneously stirred. Then 4 kg of zirconia balls having a diameter of 8 mm were added. The ball mill had a rotate speed of 500 r/min After ball milling for 60-80 h, extraction filtration and drying were carried out to obtain hollowed graphite material having a particle size of 5.0 μm;

(2) 500 g of the hollowed graphite was placed in a rotary furnace. The rotating speed was adjusted to 0.5 r/min After increasing the temperature at a rate of 5.0° C./min to 750° C. under the protection of high-purity nitrogen having a flow rate of 5.0 L/min, high-purity nitrogen was changed to a gas mixture of high-purity hydrogen and $SiH_2Cl_2$, wherein the flow rate was maintained at 10.0 L/min After maintaining the temperature for 1.0 h, the gas was changed to high-purity nitrogen, then naturally cooled to room temperature to obtain hollowed graphite/nano-silicon composite material, wherein the nano-silicon material had an average particle size of 50.0 nm;

(3) The hollowed graphite/nano-silicon composite material was added into a fusion machine for fusing for 5 h to obtain fusion precursor material. The fusion precursor material and citric acid powder in a mass ratio of 5:1 were placed in a VC mixing machine, mixed and coated for 1.5 h, then placed in a roller kiln, and increased to a temperature of 400°

C. at a rate of 3° C./min under nitrogen protection environment, and maintained at such temperature for 20 h, naturally cooled to room temperature, then crushed, smashed, sieved to obtain nano-silicon/graphite composite material coated by amorphous carbon, wherein the amorphous carbon coating layer had a thickness of 50.0 nm;

(4) The nano-silicon/graphite composite material coated by amorphous carbon was homogeneously mixed by mechanical fusion with conductive graphite in a mass ratio of 94.0:6.0, sieved and demagnetized to obtain final nano-silicon composite negative electrode material, wherein the nano-silicon material had a content of 10.0 wt. % in the negative electrode material.

Example 6

(1) 500 g of natural spherical graphite powder having an average particle size of 5-10 µm and having a carbon content of 99.95% and 1 L of water were added into a ball milling tank and homogeneously stirred. Then 4 kg of zirconia balls having a diameter of 8 mm were added. The ball mill had a rotate speed of 500 r/min After ball milling for 60-80 h, extraction filtration and drying were carried out to obtain hollowed graphite material having a particle size of 10.0 µm;

(2) 500 g of the hollowed graphite was placed in a rotary furnace. The rotating speed was adjusted to 0.5 r/min After increasing the temperature at a rate of 5.0° C./min to 400° C. under the protection of high-purity nitrogen having a flow rate of 5.0 L/min, high-purity nitrogen was changed to a gas mixture of high-purity hydrogen and SiH$_3$Cl, wherein the flow rate was maintained at 5.0 L/min. After maintaining the temperature for 8.0 h, the gas was changed to high-purity nitrogen, then naturally cooled to room temperature to obtain hollowed graphite/nano-silicon composite material, wherein the nano-silicon material had an average particle size of 200.0 nm;

(3) The hollowed graphite/nano-silicon composite material was added into a fusion machine for fusing for 5 h to obtain fusion precursor material. The fusion precursor material and citric acid powder in a mass ratio of 10:1 were placed in a VC mixing machine, mixed and coated for 1.5 h, then placed in a roller kiln, and increased under nitrogen protection environment to a temperature of 400° C. at a rate of 3° C./min, and maintained at such temperature for 20 h, naturally cooled to room temperature, then crushed, smashed, sieved to obtain nano-silicon/graphite composite material coated by amorphous carbon, wherein the amorphous carbon coating layer had a thickness of 25.0 nm;

(4) The nano-silicon/graphite composite material coated by amorphous carbon was homogeneously mixed by mechanical fusion with conductive graphite in a mass ratio of 98.0:2.0, sieved and demagnetized to obtain final nano-silicon composite negative electrode material, wherein the nano-silicon material had a content of 40.0 wt. % in the negative electrode material.

Example 7

(1) 500 g of natural spherical graphite powder having an average particle size of 16-19 µm and having a carbon content of 99.95% and 1 L of water were added into a ball milling tank and homogeneously stirred. Then 4 kg of zirconia balls having a diameter of 10 mm were added. The ball mill had a rotate speed of 480 r/min. After ball milling for 5-25 h, extraction filtration and drying were carried out to obtain hollowed graphite material having a particle size of 1.0 µm;

(2) 500 g of the hollowed graphite was placed in a rotary furnace. The rotating speed was adjusted to 0.5 r/min After increasing the temperature at a rate of 5.0° C./min to 700° C. under the protection of high-purity nitrogen having a flow rate of 1.0 L/min, high-purity nitrogen was changed to a gas mixture of high-purity hydrogen and SiHCl$_3$, wherein the flow rate was maintained at 10.0 L/min. After maintaining the temperature for 3.0 h, the gas was changed to high-purity nitrogen, then naturally cooled to room temperature to obtain hollowed graphite/nano-silicon composite material, wherein the nano-silicon composite material had an average particle size of 80.0 nm; and the nano-silicon material had a content of 35.0 wt. % in the composite material.

Comparison Example 1

(1) 500 g of natural spherical graphite powder having an average particle size of 16-19 µm and having a carbon content of 99.95% and 1 L of water were added into a ball milling tank and homogeneously stirred. Then 4 kg of zirconia balls having a diameter of 10 mm were added. The ball mill had a rotate speed of 480 r/min. After ball milling for 5-25 h, extraction filtration and drying were carried out to obtain hollowed graphite material;

(2) The hollowed graphite and nano-silicon powder having a median particle size of 10-300 nm were mixed and dispersed in an isopropanol solvent, wherein the solid content was controlled at 15% and the stirring rate was 2000 r/min, dried to obtain hollowed graphite/nano-silicon composite material;

(3) The hollowed graphite/nano-silicon composite material was added into a fusion machine for fusing for 4 h to obtain fusion precursor material. The fusion precursor material and pitch in a mass ratio of 85:15 were placed in a VC mixing machine, mixed and coated for 1 h, then placed in a roller kiln, and increased under nitrogen protection environment to a temperature of 950° C. at a rate of 5° C./min, and maintained at such temperature for 20 h, naturally cooled to room temperature, then crushed, smashed, sieved to obtain nano-silicon/graphite composite material coated by amorphous carbon, wherein the amorphous carbon coating layer had a thickness of 100.0 nm;

(4) The nano-silicon/graphite composite material coated by amorphous carbon was homogeneously mixed with conductive carbon black Super-P in a mass ratio of 95.0:5.0 in a fusion machine, sieved and demagnetized to obtain final nano-silicon composite negative electrode material, wherein the nano-silicon material had a content of 30.0 wt. % in the negative electrode material.

The electrochemical testing results of the negative electrode materials prepared in Examples 1-7 and Comparison Example 1 are shown in Table 1.

TABLE 1

| | 1st reversible capacity (mAh/g) | 1st discharge capacity (mAh/g) | First Coulombic efficiency (%) | Retention rate after 500 cycles (%) |
|---|---|---|---|---|
| Example 1 | 1086.9 | 1163.7 | 93.4 | 80.1 |
| Example 2 | 398.0 | 419.0 | 95.0 | 98.5 |
| Example 3 | 2151.9 | 2308.9 | 93.2 | 72.1 |
| Example 4 | 1580.6 | 1697.7 | 93.1 | 75.6 |
| Example 5 | 674.8 | 717.1 | 94.1 | 91.2 |
| Example 6 | 1336.5 | 1434.0 | 93.2 | 78.7 |
| Example 7 | 1214.0 | 1291.5 | 94.0 | 70.5 |
| Comparison Example 1 | 947.1 | 1155.0 | 82.0 | 35.2 |

It can be seen according to Table 1 that, without vapor deposition and under the conditions that other operation conditions and raw materials are the same as those in Example 1, the 1st reversible capacity (mAh/g), 1st discharge capacity (mAh/g), First Coulombic efficiency (%) and capacity retention rate after 500 cycles (%) in Comparison Example 1 are obviously lower than those of the negative electrode material prepared by vapor deposition in the examples. Moreover, the negative electrode materials prepared by other technical solutions of the present invention also have notably excellent First Coulombic efficiency (%) and capacity retention rate after 500 cycles (%) as compared to Comparison Example 1. Therefore, the negative electrode materials prepared by chemical vapor depositing nano-silicon particles inside hollowed graphite have notably improved electrical properties.

The applicant declares that, the present invention describes detailed technological devices and processes by the aforesaid examples, but the present invention is not limited by the aforesaid detailed technological devices and processes. That is to say, it does not mean that the present invention cannot be fulfilled unless relying on the aforesaid detailed technological devices and processes. Those skilled in the art shall know that, any amendment, equivalent change to the product materials of the present invention, addition of auxiliary ingredients, and selection of any specific modes all fall within the protection scope and disclosure scope of the present invention.

The invention claimed is:

1. A nano-silicon composite negative electrode material, comprising;
    a graphite matrix composed of hollowed graphite;
    a nano-silicon material chemical-vapor deposited inside the graphite matrix;
    an amorphous carbon coating layer; and
    a nano-conductive material coating layer on the surface of the graphite matrix,
    wherein the nano-conductive material coating layer comprises a material selected from the group consisting of carbon nanotubes, graphene, conductive graphite, carbon fibers, nano graphite, conductive carbon black, and combinations thereof, and
    wherein the nano-conductive material coating layer is included at from 0.1 wt. % to 10.0 wt. % in the negative electrode material.

2. The nano-silicon composite negative electrode material according to claim 1, wherein the nano-silicon composite negative electrode material is composed of the graphite matrix, the nano-silicon material deposited inside the graphite matrix, an amorphous carbon coating layer, and a nano-conductive material coating layer on a surface of the graphite matrix.

3. The nano-silicon composite negative electrode material according to claim 1, wherein the nano-silicon material is crystal and/or non-crystal.

4. The nano-silicon composite negative electrode material according to claim 1, wherein the nano-silicon material is monodispersed nano-silicon particles.

5. The nano-silicon composite negative electrode material according to claim 1, wherein the nano-silicon material has a content of from 1.0 to 80.0 wt. % in the negative electrode material.

6. The nano-silicon composite negative electrode material according to claim 1, wherein the amorphous carbon coating layer is obtained by coating with pitch and/or polymers and carbonizing.

7. The nano-silicon composite negative electrode material according to claim 1, wherein the amorphous carbon coating layer is obtained by decomposing one or a mixture of at least two of organic carbon source gases at a high temperature.

8. A process for preparing a nano-silicon composite negative electrode material as in claim 1, comprising chemical-vapor depositing nano-silicon particles with silicon source inside hollowed graphite.

9. The preparation process according to claim 8, comprising the following steps,
    (1) Preparing hollowed graphite;
    (2) Chemical-vapor depositing nano-silicon particles with silicon source inside the hollowed graphite; and optionally the following steps:
    (3) Mechanically fusing the material obtained in step (2), and then conducting amorphous-carbon coating;
    (4) Proceeding the material obtained in step (3) to nano-conductive material coating modification;
    (5) Sieving and demagnetizing the material obtained in step (4).

10. The preparation process according to claim 8, wherein the hollowed graphite is prepared by mechanical processing.

11. The preparation process according to claim 10, wherein the mechanical processing comprises processing graphite material into graphite particles, and then grinding to obtain the hollowed graphite.

12. The preparation process according to claim 8, wherein the silicon source is one selected from the group consisting of $SiH_4$, $Si_2H_6$, $Si_3H_8$, $SiCl_4$, $SiHCl_3$, $Si_2Cl_6$, $SiH_2Cl_2$ or $SiH_3Cl$, or a combination thereof.

13. The preparation process according to claim 8, wherein the chemical vapor deposition is one selected from the group consisting of thermochemical vapor deposition, plasma-enhanced chemical vapor deposition and microwave plasma-assisted chemical vapor deposition.

14. The preparation process according to claim 9, wherein the coating in step (3) is one selected from the group consisting of solid phase coating, liquid phase coating or gaseous phase coating.

15. The preparation process according to claim 9, wherein the coating modification in step (4) is one selected from the group consisting of mechanical modification, nano-dispersion or liquid phase coating.

16. A lithium ion battery, wherein the lithium ion battery comprises the nano-silicon composite negative electrode material according to claim 1.

* * * * *